US012713810B2

(12) United States Patent
Lee et al.

(10) Patent No.: US 12,713,810 B2
(45) Date of Patent: Aug. 18, 2026

(54) WINDOW AND DISPLAY PANEL INCLUDING THE SAME

(71) Applicant: Samsung Display Co., Ltd., Yongin-si (KR)

(72) Inventors: Chaekyeong Lee, Yongin-si (KR); Seungkuk Kuk, Yongin-si (KR); Wonjong Baek, Yongin-si (KR); Jongseok Joo, Yongin-si (KR); Jeongseok Lee, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 136 days.

(21) Appl. No.: 18/901,397

(22) Filed: Sep. 30, 2024

(65) Prior Publication Data

US 2025/0221246 A1 Jul. 3, 2025

(30) Foreign Application Priority Data

Dec. 28, 2023 (KR) ........................ 10-2023-0195383

(51) Int. Cl.
*H10K 59/80* (2023.01)
*G02B 1/18* (2015.01)

(52) U.S. Cl.
CPC ............. *H10K 59/871* (2023.02); *G02B 1/18* (2015.01); *H10K 59/873* (2023.02); *H10K 59/879* (2023.02); *H10K 59/8792* (2023.02)

(58) Field of Classification Search
CPC ..... C03C 17/73; C03C 17/3482; C03C 17/34; G02B 1/18; G02B 1/115; H10K 59/8792; H10K 59/873; H10K 59/879; H10K 59/871
See application file for complete search history.

(56) References Cited

U.S. PATENT DOCUMENTS

| | | | | |
|---|---|---|---|---|
| 2010/0027123 | A1* | 2/2010 | Imai ....................... | G02B 1/115 428/317.9 |
| 2017/0160434 | A1 | 6/2017 | Hart et al. | |
| 2021/0351380 | A1 | 11/2021 | Sun et al. | |
| 2022/0123027 | A1* | 4/2022 | Zhang ...................... | G09G 3/20 |
| 2023/0010461 | A1 | 1/2023 | Hart et al. | |
| 2023/0072027 | A1* | 3/2023 | Ishimura .................. | G02C 7/02 |

FOREIGN PATENT DOCUMENTS

JP 2023-092192 7/2023

* cited by examiner

*Primary Examiner* — Anne M Hines
(74) *Attorney, Agent, or Firm* — Lerner David LLP

(57) ABSTRACT

Provided are a window and a display panel including the window. The window includes a window substrate, an anti-reflection layer disposed on the window substrate, an anti-fingerprint layer disposed over the anti-reflection layer, and an intermediate layer disposed between the anti-reflection layer and the anti-fingerprint layer, wherein the anti-reflection layer includes a first sub-layer including a first inorganic insulating material, and a second sub-layer including a second inorganic insulating material different from the first inorganic insulating material, and the first inorganic insulating material includes two or more types of inorganic insulating materials including aluminum oxide.

22 Claims, 9 Drawing Sheets

WINDOW AND DISPLAY PANEL INCLUDING THE SAME

CROSS-REFERENCE TO RELATED APPLICATION(S)

This application claims priority to and benefits of Korean Patent Application No. 10-2023-0195383 under 35 U.S.C. § 119, filed on Dec. 28, 2023, in the Korean Intellectual Property Office, the entire contents of which are incorporated herein by reference.

BACKGROUND

1. Technical Field

One or more embodiments relate to a window and a display panel including the window.

2. Description of the Related Art

Various types of display apparatuses based on mobility have been used, and such a display apparatus includes a display panel that provides an image and a window that protects the display panel.

The window may include a coating layer that reduces reflectance of light incident from the outside to improve visibility.

For example, the window may include a coating layer to protect the display panel from contaminants including oil, fingerprints, and various foreign materials.

SUMMARY

One or more embodiments include a window having high hardness and low reflection characteristics, and a display panel including the window. However, the embodiments are examples and do not limit the scope of the disclosure.

Additional aspects will be set forth in part in the description which follows and, in part, will be apparent from the description, or may be learned by practice of the embodiments of the disclosure.

According to one or more embodiments, a window may include a window substrate, an anti-reflection layer disposed on the window substrate, an anti-fingerprint layer disposed over the anti-reflection layer, and an intermediate layer disposed between the anti-reflection layer and the anti-fingerprint layer, wherein the anti-reflection layer may include a first sub-layer including a first inorganic insulating material, and a second sub-layer including a second inorganic insulating material different from the first inorganic insulating material, and the first inorganic insulating material includes two or more types of inorganic insulating materials including aluminum oxide.

According to an embodiment, the first inorganic insulating material may include yttrium oxide.

According to an embodiment, the first sub-layer may include at least about 80 weight % of aluminum oxide based on a total weight of the first sub-layer.

According to an embodiment, the second inorganic insulating material may include two or more types of inorganic insulating materials including zirconium oxide.

According to an embodiment, the second inorganic insulating material may include tantalum oxide.

According to an embodiment, the second sub-layer may include at least about 80 weight % of zirconium oxide based on a total weight of the second sub-layer.

According to an embodiment, the anti-reflection layer may have a structure in which the first sub-layer and the second sub-layer are alternately stacked with each other.

According to an embodiment, a refractive index of the first sub-layer may be less than a refractive index of the second sub-layer.

According to an embodiment, a refractive index of the first sub-layer may be in a range of about 1.2 to about 2.0.

According to an embodiment, a refractive index of the second sub-layer may be in a range of about 1.5 to about 2.6.

According to an embodiment, the window may have a reflectance of less than about 2.0%.

According to an embodiment, the window may have a surface hardness of about 10 GPa or more.

According to one or more embodiments, a display panel may include a substrate, a display element arranged in a display area of the substrate, the display element including a first electrode, a second electrode, and an emission layer disposed between the first electrode and the second electrode, an encapsulation member disposed on the display element, and a window disposed on the encapsulation member, wherein the window may include a window substrate, an anti-reflection layer disposed on the window substrate, an anti-fingerprint layer disposed over the anti-reflection layer, and an intermediate layer disposed between the anti-reflection layer and the anti-fingerprint layer, the anti-reflection layer includes a first sub-layer including a first inorganic insulating material, and a second sub-layer including a second inorganic insulating material different from the first inorganic insulating material, and the first inorganic insulating material includes two or more types of inorganic insulating materials including aluminum oxide.

According to an embodiment, the first inorganic insulating material may include yttrium oxide.

According to an embodiment, the first sub-layer may include at least about 80 weight % of aluminum oxide based on a total weight of the first sub-layer.

According to an embodiment, the second inorganic insulating material may include two or more types of inorganic insulating materials including zirconium oxide.

According to an embodiment, the second inorganic insulating material may include tantalum oxide.

According to an embodiment, the anti-reflection layer may have a structure in which the first sub-layer and the second sub-layer are alternately stacked with each other.

According to an embodiment, a refractive index of the first sub-layer may be less than a refractive index of the second sub-layer.

According to an embodiment, a refractive index of the first sub-layer may be in a range of about 1.2 to about 2.0.

According to an embodiment, the window may have a reflectance of less than about 2.0%.

According to an embodiment, the window may have a surface hardness of about 10 GPa or more.

BRIEF DESCRIPTION OF THE DRAWINGS

The above and other aspects, features, and advantages of embodiments will be more apparent from the following description taken in conjunction with the accompanying drawings, in which.

DETAILED DESCRIPTION OF THE EMBODIMENTS

Figure 1:
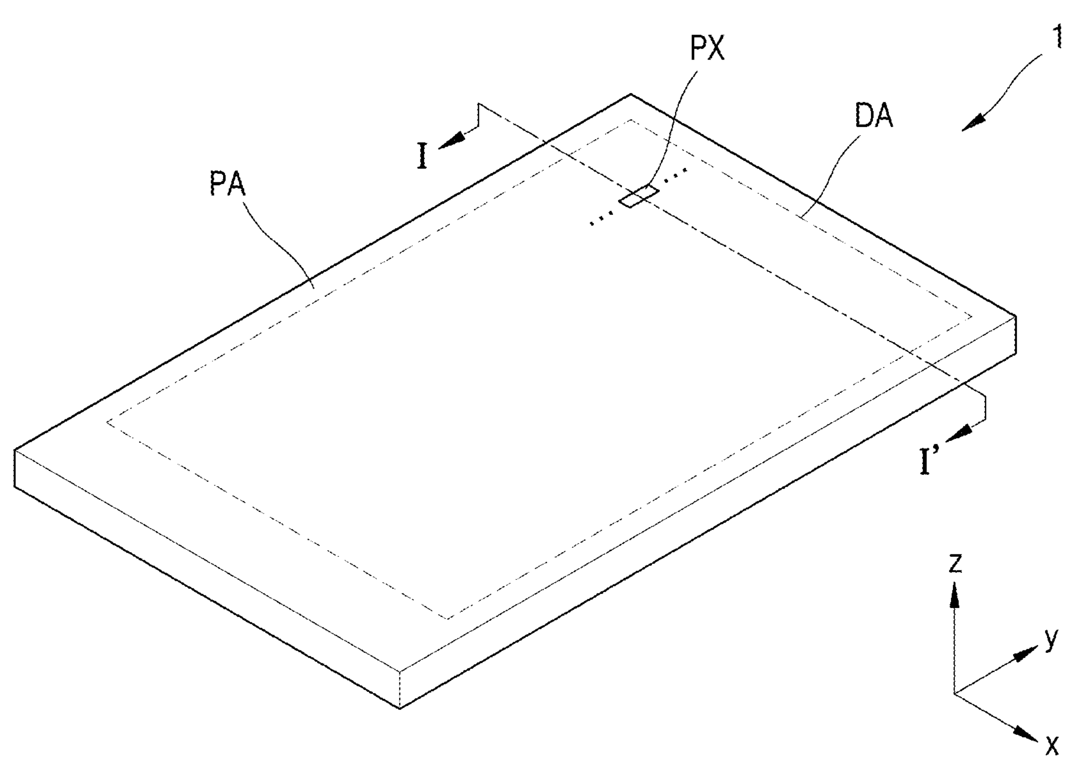
FIG. 1 is a schematic perspective view of an electronic apparatus according to an embodiment.

Reference will now be made in detail to embodiments, examples of which are illustrated in the accompanying drawings, wherein like reference numerals refer to like elements throughout. In this regard, the embodiments may have different forms and should not be construed as being limited to the descriptions set forth herein. Accordingly, the embodiments are merely described below, by referring to the figures, to explain aspects of the description. As used herein, the term "and/or" includes any and all combinations of one or more of the associated listed items. Throughout the disclosure, the expression "at least one of a, b or c" indicates only a, only b, only c, both a and b, both a and c, both b and c, all of a, b, and c, or variations thereof.

Because various modifications may be applied and one or more embodiments may be implemented, specific embodiments will be shown in the drawings and described in detail in the detailed description. Effects and features, and methods for achieving them will be clarified with reference to embodiments described below in detail with reference to the drawings. However, the embodiments may have different forms and should not be construed as being limited to the descriptions set forth herein.

Hereinafter, the embodiments will now be described in detail with reference to the accompanying drawings. When described with reference to the drawings, identical or corresponding elements will be given the same reference numerals, and redundant description of these elements will be omitted.

It will be understood that although terms "first" and "second" may be used herein to describe various elements, these elements should not be limited by these terms and these terms are only used to distinguish one element from another.

In the following embodiments, the singular forms include the plural forms unless the context clearly indicates otherwise.

It will be understood that terms "comprise," "include," and "have" used herein specify the presence of stated features or elements, but do not preclude the presence or addition of one or more other features or elements.

It will be further understood that, when a layer, region, or element is referred to as being "on" another layer, region, or element, it can be directly or indirectly on the other layer, region, or element. That is, for example, intervening layers, regions, or elements may be present.

Sizes of elements in the drawings may be exaggerated for convenience of description. For example, because sizes and thicknesses of elements in the drawings are arbitrarily illustrated for convenience of explanation, the following embodiments are not limited thereto.

When a certain embodiment may be implemented differently, a specific process order may also be performed differently from the described order. As an example, two processes that are successively described may be performed substantially simultaneously or performed in an order opposite to the order described.

The expression "A and/or B" used herein indicates A, B, or A and B. The expression such as "at least one of A or B" indicates A, B, or A and B.

It will be understood that when a layer, region, or element is referred to as being "connected to" another layer, region, or element, it may be "directly connected to" the other layer, region, or element or may be "indirectly connected to" the other layer, region, or element with one or more intervening layers, regions, or elements therebetween. For example, it will be understood that when a layer, region, or element is referred to as being "electrically connected to" another layer, region, or element, it may be "directly electrically connected to" the other layer, region, or element and/or may be "indirectly electrically connected to" the other layer, region, or element with one or more intervening layers, regions, or elements therebetween.

The x-axis, the y-axis, and the z-axis are not limited to three axes of the rectangular coordinate system and may be interpreted in a broader sense. For example, the x-axis, y-axis, and z-axis may be orthogonal to each other, but may refer to different directions that are not orthogonal to each other.

Figure 2:
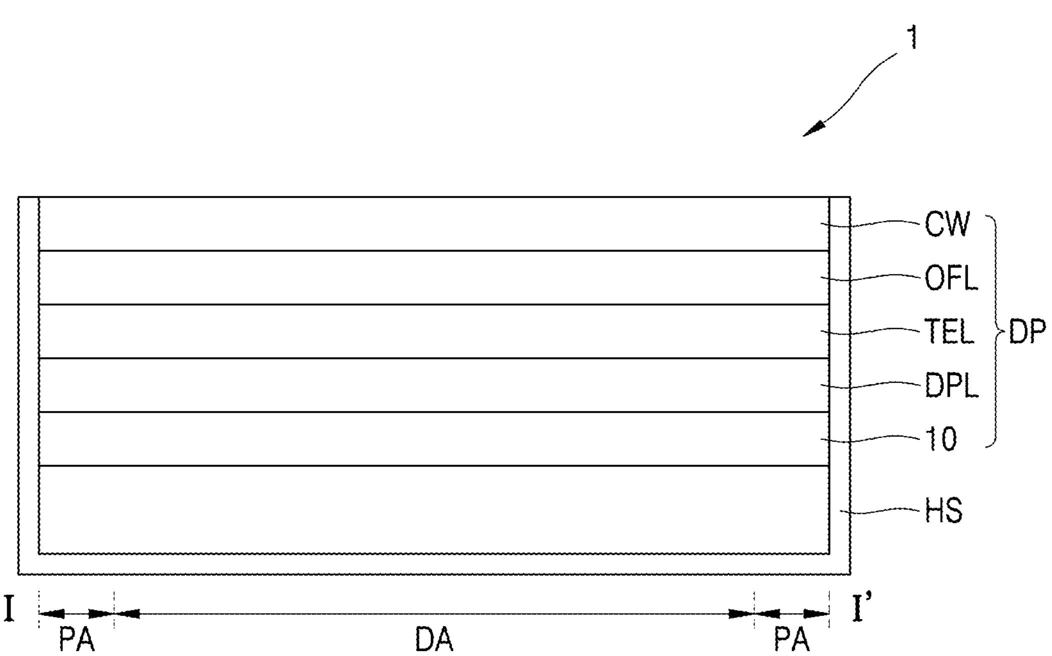
FIG. 2 is a schematic cross-sectional view of an electronic apparatus according to an embodiment.
Figure 3:
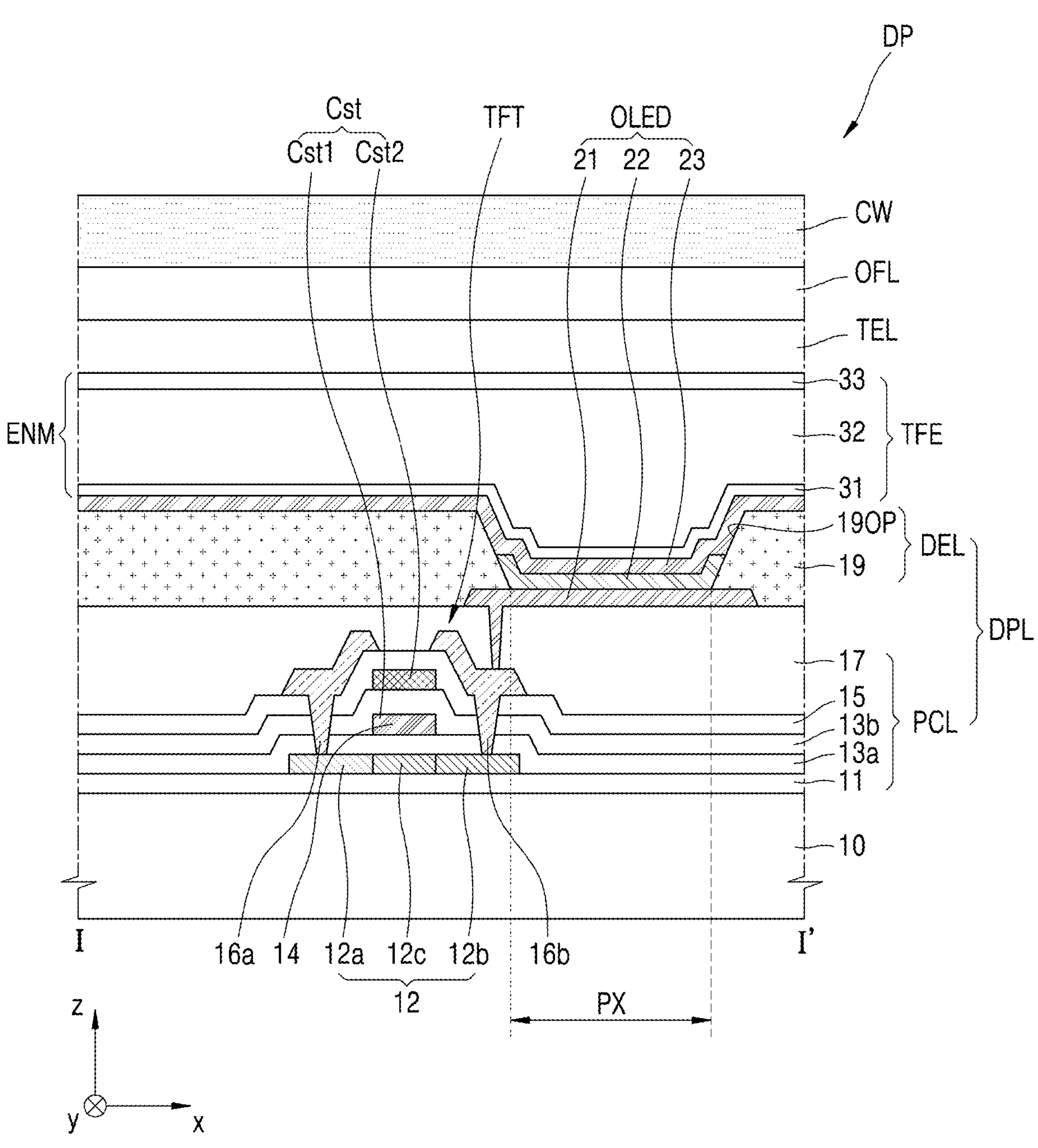
FIG. 3 is a schematic cross-sectional view of a display panel according to an embodiment.

FIG. 1 is a schematic perspective view of an electronic apparatus 1 according to an embodiment, and FIG. 2 is a schematic cross-sectional view of the electronic apparatus 1 according to an embodiment, taken along a line I-I' of FIG. 1. FIG. 3 is a schematic cross-sectional view of a display panel DP according to an embodiment, illustrating a structure of a display area.

Referring to FIGS. 1 and 2, the electronic apparatus 1 may display a video or a still image, and may be used as a display screen of not only portable electronic apparatuses, such as a mobile phone, a smartphone, a tablet personal computer (PC), a mobile communication terminal, an electronic notebook, an electronic book, a portable multimedia player (PMP), a navigation apparatus, and an ultra-mobile PC (UMPC), but also various products, such as a television, a laptop computer, a monitor, a billboard, and an Internet of things (IoT) apparatus. For example, the electronic apparatus 1 according to an embodiment may be used in a wearable apparatus such as a smart watch, a watch phone, a glasses-type display, and a head-mounted display (HMD). Furthermore, the electronic apparatus 1 according to an embodiment may be used as a display for an instrument panel for vehicles, a center information display (CID) on the center fascia or dashboard of vehicles, a room mirror display in lieu of a side mirror of vehicles, or a display arranged at the rear side of a front seat as an entertainment apparatus for a rear seat of vehicles. For convenience of description, FIG. 1 illustrates that the electronic apparatus 1 according to an embodiment is used as a smartphone.

The electronic apparatus 1 may have a rectangular shape in a plan view. For example, the electronic apparatus 1 may have a rectangular planar shape having short sides in an x-direction and long sides in a y-direction, as shown in FIG. 1. A corner where a short side in the x-direction and a long side in the y-direction meet may be rounded to have a certain curvature or may be formed at a right angle. The planar shape of the electronic apparatus 1 is not limited to a rectangular shape, and the electronic apparatus 1 may have another shape such as a polygonal, oval, or irregular shape.

Referring to FIG. 2, the electronic apparatus 1 may include a housing HS and a display panel DP. The housing HS may accommodate the display panel DP. FIG. 2 illustrates that the housing HS surrounds (e.g., integrally surrounds) edge portions (or sides) of the display panel DP, but embodiments are not limited thereto. In an embodiment, the housing HS may have a shape in which two or more members are combined with each other, rather than being formed as a single body. In addition to the display panel DP, components for driving the electronic apparatus 1, for example, a power supply such as a battery, or a circuit board, may be mounted (or accommodated) in the housing HS.

The display panel DP may include a display area DA and a peripheral area PA outside the display area DA. The display panel DP may provide an image via an array of subpixels PX arranged in the display area DA. Each subpixel PX may include display elements (or light-emitting elements) electrically connected to a subpixel circuit. A display element may include a light-emitting diode, for example, an organic light-emitting diode including an organic emission layer.

Each subpixel PX may emit red light, green light, or blue light. In another example, each subpixel PX may emit red light, green light, blue light, or white light.

Referring to FIGS. 2 and 3, the display panel DP may include a stack structure of a substrate 10, a display layer DPL on the substrate 10, a touch electrode layer TEL, an optical functional layer OFL, and a window CW. The display layer DPL may include a subpixel circuit layer PCL including a thin-film transistor TFT, a display element layer DEL including a display element, and an encapsulation member ENM such as a thin-film encapsulation layer TFE or an encapsulation substrate. Insulating layers may be between the substrate 10 and the display layer DPL or in the display layer DPL. The display element may include a light-emitting diode, and in an embodiment, FIG. 3 illustrates that the display element is an organic light-emitting diode. Hereinafter, it is described that the electronic apparatus 1 includes an organic light-emitting diode OLED as a display element, but embodiments are not limited thereto. In an embodiment, the display element may be an inorganic light-emitting diode including an inorganic material or a quantum dot light-emitting diode including quantum dots. For example, an emission layer of the display element may include an organic material, an inorganic material, quantum dots, an organic material and quantum dots, or an inorganic material and quantum dots.

The substrate 10 may include glass or polymer resin. For example, the polymer resin may include at least one of polyethersulfone, polyarylate, polyether imide, polyethylene naphthalate, polyethylene terephthalate, polyphenylene sulfide, polyimide, polycarbonate, cellulose triacetate, or cellulose acetate propionate.

The subpixel circuit layer PCL may be disposed on the substrate 10. FIG. 3 illustrates that the subpixel circuit layer PCL includes the thin-film transistor TFT, and a buffer layer 11, a first insulating layer 13*a*, a second insulating layer 13*b*, a third insulating layer 15, and a planarization layer 17, which are disposed under and/or over components of the thin-film transistor TFT.

The buffer layer 11 may reduce or prevent the penetration of foreign materials, moisture, or external air from under the substrate 10 and may provide a flat surface on the substrate 10. The buffer layer 11 may include an inorganic insulating material, such as silicon nitride, silicon oxynitride, or silicon oxide, and may include a single layer or a multilayer including the aforementioned inorganic insulating material.

The thin-film transistor TFT on the buffer layer 11 may include a semiconductor layer 12, and the semiconductor layer 12 may include polysilicon. In another example, the semiconductor layer 12 may include amorphous silicon, an oxide semiconductor, or an organic semiconductor. The semiconductor layer 12 may include a channel region 12*c* and a drain region 12*a* and a source region 12*b* respectively on sides (e.g., opposite sides) of the channel region 12*c*. A gate electrode 14 may overlap the channel region 12*c*.

The gate electrode 14 may include a low-resistance metal material. The gate electrode 14 may include a conductive material including molybdenum (Mo), aluminum (Al), copper (Cu), titanium (Ti), or the like, and may include a multilayer or a single layer including the aforementioned material.

The first insulating layer 13*a* may be between the semiconductor layer 12 and the gate electrode 14. The first insulating layer 13*a* may include an inorganic insulating material, such as silicon oxide ($SiO_x$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), or zinc oxide ($ZnO_2$).

The second insulating layer 13*b* may be provided to cover the gate electrode 14. The second insulating layer 13*b* may include an inorganic insulating material, such as $SiO_x$, $SiN_x$, SiON, $Al_2O_3$, $TiO_2$, $Ta_2O_5$, $HfO_2$, or $ZnO_2$.

An upper electrode Cst2 of a storage capacitor Cst may be disposed on the second insulating layer 13*b*. The upper electrode Cst2 may at least partially overlap the gate electrode 14 arranged thereunder. The gate electrode 14 and the upper electrode Cst2 overlapping each other with the second insulating layer 13*b* therebetween may form the storage capacitor Cst. For example, the gate electrode 14 may function as a lower electrode Cst1 of the storage capacitor Cst.

As described above, the storage capacitor Cst may overlap the thin-film transistor TFT. In another example, the storage capacitor Cst may not overlap the thin-film transistor TFT. For example, the lower electrode Cst1 of the storage capacitor Cst is a separate component from the gate electrode 14 and may be formed to be spaced apart from the gate electrode 14.

The upper electrode Cst2 may include aluminum (Al), platinum (Pt), palladium (Pd), silver (Ag), magnesium (Mg), gold (Au), nickel (Ni), neodymium (Nd), iridium (Ir), chromium (Cr), calcium (Ca), molybdenum (Mo), titanium (Ti), tungsten (W), and/or copper (Cu) and may include a single layer or a multilayer including the aforementioned material.

The third insulating layer 15 may cover the upper electrode Cst2. The third insulating layer 15 may include an inorganic insulating material, such as $SiO_x$, $SiN_x$, SION, $Al_2O_3$, $TiO_2$, $Ta_2O_5$, $HfO_2$, or $ZnO_2$. The third insulating layer 15 may include a single layer or a multilayer including the aforementioned inorganic insulating material.

Each of a drain electrode 16*a* and a source electrode 16*b* may be disposed on the third insulating layer 15. The drain electrode 16*a* and the source electrode 16*b* may be respectively connected to the drain region 12*a* and the source region 12*b* through contact holes of insulating layers thereunder. The drain electrode 16*a* and the source electrode 16*b* may include a material having excellent conductivity. The drain electrode 16*a* and the source electrode 16*b* may include a conductive material including Mo, Al, Cu, Ti, or the like, and may include a multilayer or a single layer. In an embodiment, the drain electrode 16*a* and the source electrode 16*b* may each include a multilayer structure of Ti/Al/Ti.

The planarization layer 17 may include an organic insulating material. The planarization layer 17 may include an organic insulating material such as a general-purpose polymer (e.g., polymethyl methacrylate (PMMA) or polystyrene (PS)), a polymer derivative having a phenol-based group, an acrylic polymer, an imide-based polymer, an aryl ether-based polymer, an amide-based polymer, a fluorinated polymer, a p-xylene-based polymer, a vinyl alcohol-based polymer, or any blend thereof.

The display element layer DEL may be disposed on the subpixel circuit layer PCL having the aforementioned structure. The display element layer DEL may include the organic light-emitting diode OLED as a display element, and the organic light-emitting diode OLED may include a stack structure of a subpixel electrode 21, an emission layer 22, and a common electrode 23. The subpixel electrode 21 of the organic light-emitting diode OLED may be electrically connected to the thin-film transistor TFT through a contact hole defined in the planarization layer 17.

The subpixel electrode 21 may include a conductive oxide material such as indium tin oxide (ITO), indium zinc oxide (IZO), zinc oxide (ZnO), indium oxide ($In_2O_3$), indium gallium oxide (IGO), or aluminum zinc oxide (AZO). In an embodiment, the subpixel electrode 21 may include a reflective layer including Ag, Mg, Al, Pt, Pd, Au, Ni, Nd, Ir, Cr, or any compound thereof. In another example, the subpixel electrode 21 may further include a layer including ITO, IZO, ZnO, or $In_2O_3$ over/under the aforementioned reflective layer. In an embodiment, the subpixel electrode 21 may be a first electrode.

A bank layer 19 having an opening 19OP that exposes at least a portion of the subpixel electrode 21 may be disposed on the subpixel electrode 21. The bank layer 19 may include an organic insulating material and/or an inorganic insulating material. The opening 19OP may define an emission area of light emitted from the organic light-emitting diode OLED. For example, the size and/or width of the opening 19OP may correspond to the size and/or width of the emission layer. Accordingly, the size and/or width of the subpixel PX may depend on the size and/or width of the opening 19OP of the bank layer 19 corresponding thereto.

The emission layer 22 may arranged in the opening 19OP of the bank layer 19. The emission layer 22 may include a polymer organic material or low molecular weight organic material emitting light of a certain color. In another example, the emission layer 22 may include an inorganic light-emitting material or quantum dots.

For example, a first functional layer and a second functional layer may be arranged under and over the emission layer 22. The first functional layer may include, for example, a hole transport layer (HTL) or may include an HTL and a hole injection layer (HIL). The second functional layer may include an electron transport layer (ETL) and/or an electron injection layer (EIL). However, embodiments are not limited thereto. The first functional layer and the second functional layer may be selectively arranged over and under the emission layer 22, respectively.

The first functional layer and/or the second functional layer may be a common layer that is formed to cover (e.g., entirely cover) the substrate 10 as with the common electrode 23 which will be described below.

The common electrode 23 may be disposed on the subpixel electrode 21 and overlap the subpixel electrode 21. The common electrode 23 may include a conductive material having a low work function. For example, the common electrode 23 may include a transparent layer or a semi-transparent layer including Ag, Mg, Al, Pt, Pd, Au, Ni, Nd, Ir, Cr, lithium (Li), Ca, or any alloy thereof. In another example, the common electrode 23 may further include a layer, such as ITO, IZO, ZnO, or $In_2O_3$, on the transparent layer or the semi-transparent layer including the aforementioned material. The common electrode 23 may be formed as a single body to cover (e.g., entirely cover) the substrate 10. In an embodiment, the common electrode 23 may be a second electrode.

The encapsulation member ENM may be disposed on the display element layer DEL. In an embodiment, the encapsulation member ENM may include the thin-film encapsulation layer TFE, as shown in FIG. 3. However, embodiments are not limited thereto. In another embodiment, the encapsulation member ENM may include an encapsulation substrate. For example, the encapsulation substrate may include glass. In an embodiment, the glass may include ultra-thin glass (UTG).

The thin-film encapsulation layer TFE may be disposed on the display element layer DEL and may cover the display element layer DEL. The thin-film encapsulation layer TFE may include at least one inorganic layer and at least one organic layer. In an embodiment, the thin-film encapsulation layer TFE may include a first inorganic layer 31, an organic layer 32, and a second inorganic layer 33, which are sequentially stacked. The first inorganic layer 31 and the second inorganic layer 33 may each include one or more inorganic materials selected from among aluminum oxide, titanium oxide, tantalum oxide, hafnium oxide, zinc oxide, silicon oxide, silicon nitride, and silicon oxynitride. The organic layer 32 may include a polymer-based material. The polymer-based material may include acrylic resin, epoxy-based resin, polyimide, and polyethylene. In an embodiment, the organic layer 32 may include acrylate. The organic layer 32 may be formed by curing monomer or applying polymer.

The touch electrode layer TEL may be disposed on the encapsulation member ENM, for example, the thin-film encapsulation layer TFE. The touch electrode layer TEL may obtain coordinate information according to an external input, for example, a touch event. The touch electrode layer TEL may include a touch electrode and trace lines connected to the touch electrode. The touch electrode layer TEL may sense an external input by using a mutual capacitance method or a self-capacitance method.

The touch electrode layer TEL may be formed (e.g., directly formed) on the display element layer DEL or may be separately formed and then bonded via an adhesive member such as an optical clear adhesive (OCA). FIGS. 2 and 3 illustrate that the touch electrode layer TEL is disposed between the display element layer DEL and the optical functional layer OFL, but in another embodiment, the touch electrode layer TEL may be arranged over the optical functional layer OFL.

The optical functional layer OFL may reduce reflectance of light (e.g., external light) incident from the outside toward the electronic apparatus 1 and may improve color purity of light emitted from the electronic apparatus 1. In an embodiment, the optical functional layer OFL may include a retarder and/or a polarizer. The retarder may include a film-type retarder or a liquid crystal coating-type retarder, and may include a $\lambda/2$ retarder and/or a $\lambda/4$ retarder. For example, the polarizer may include a film-type polarizer or a liquid crystal coating-type polarizer. The film-type polarizer may include a stretched synthetic resin film, and the liquid crystal coating-type polarizer may include liquid crystals arranged in a certain array.

In an embodiment, the optical functional layer OFL may include a destructive interference structure. The destructive interference structure may include a first reflective layer and a second reflective layer, which are arranged on different layers. First reflected light and second reflected light respectively reflected from the first reflective layer and the second reflective layer may destructively interfere with each other, and accordingly, the reflectance of external light may be reduced.

The adhesive member may be disposed between the touch electrode layer TEL and the optical functional layer OFL. For the adhesive member, a general adhesive member may be used without limitation. For example, the adhesive member may include an optical clear adhesive (OCA).

The window CW may be disposed on the optical functional layer OFL. The window CW may be formed (e.g., directly formed) on the optical functional layer OFL or may be separately formed and then attached to the optical functional layer OFL via an adhesive member, which is disposed between the window CW and the optical functional layer OFL. For example, the adhesive member may include an optical clear adhesive (OCA).

Figure 4:
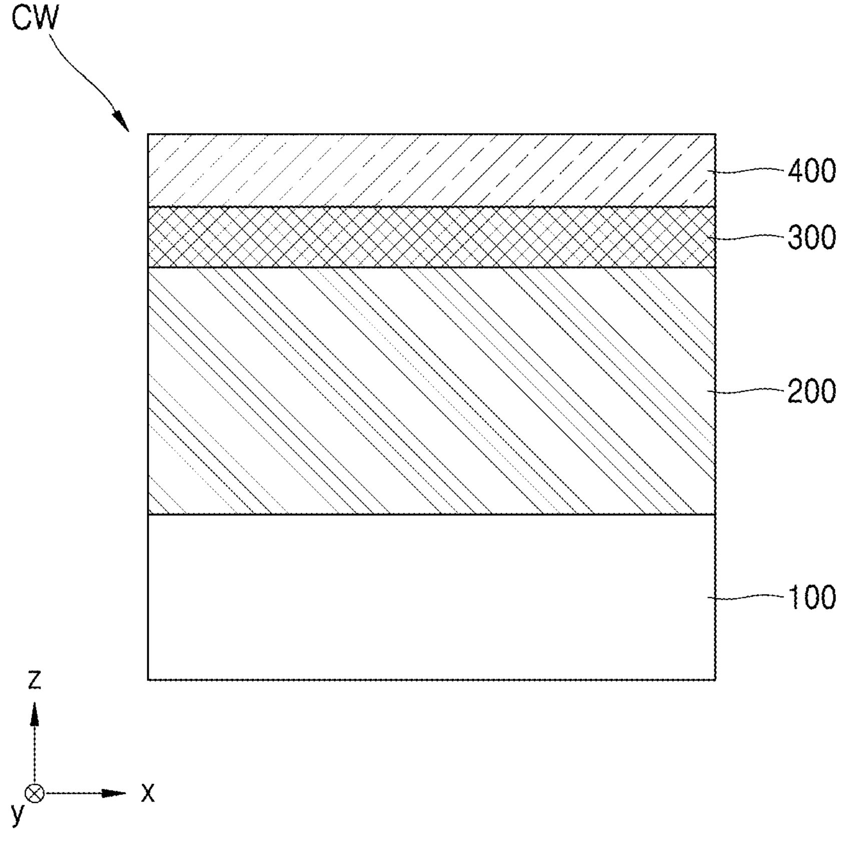
FIG. 4 is a schematic cross-sectional view of a window according to an embodiment.
Figure 5:
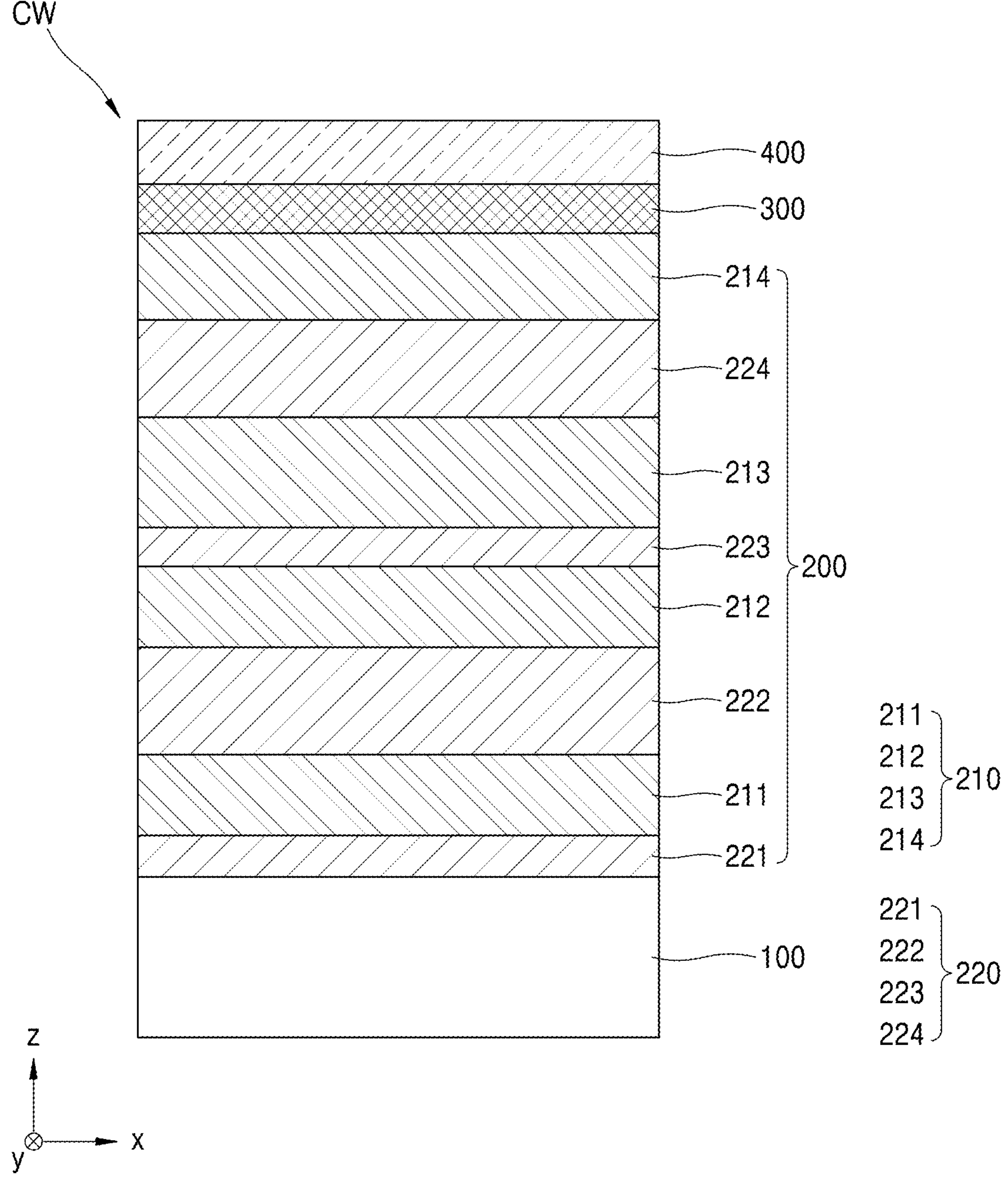
FIG. 5 is a schematic cross-sectional view of a window according to an embodiment.

FIG. 4 is a schematic cross-sectional view of a window according to an embodiment, and FIG. 5 is a schematic cross-sectional view of a window according to an embodiment.

Referring to FIG. 4, the window CW may include a window substrate 100, an anti-reflection layer 200, an intermediate layer 300, and an anti-fingerprint layer 400.

The window substrate 100 may include glass or polymer resin. In an embodiment, the window substrate 100 may include, for example, a polymer resin such as polyethersulfone, polyacrylate, polyether imide, polyethylene naphthalate, polyethylene terephthalate, polyphenylene sulfide, polyarylate, polyimide, polycarbonate, or cellulose acetate propionate. In an embodiment, the window substrate 100 may include ultra-thin glass (UTG) with enhanced strength through chemical strengthening or thermal strengthening.

The anti-reflection layer 200 may be disposed on the window substrate 100. The anti-reflection layer 200 may reduce the reflectance of light incident from the outside.

Referring to FIGS. 4 and 5, the anti-reflection layer 200 may have a stack structure including sub-layers. In an embodiment, the sub-layers of the anti-reflection layer 200 may include a first sub-layer 210 including a first inorganic insulating material and a second sub-layer 220 including a second inorganic insulating material, which is different from the first inorganic insulating material.

The first inorganic insulating material of the first sub-layer 210 may include two or more types of inorganic insulating materials including $Al_2O_3$. The first inorganic insulating material of the first sub-layer 210 may include $Al_2O_3$ as a main component. For example, based on the total weight of the first sub-layer 210, the first sub-layer 210 may include $Al_2O_3$ in a range of about 80 weight % or more. For example, the first sub-layer 210 may include $Al_2O_3$ in a range of about 80 weight % to about 99.9 weight %. For example, the first sub-layer 210 may include $Al_2O_3$ in a range of about 90 weight % to less than about 99.9 weight %.

The first inorganic insulating material of the first sub-layer 210 may include, as a secondary component, at least one inorganic insulating material including an element other than aluminum. The first inorganic insulating material of the first sub-layer 210 may include oxide, nitride, or fluoride of at least one metal selected from among yttrium, magnesium, zirconium, calcium, barium, titanium, tantalum, molybdenum, and germanium. In an embodiment, the first inorganic insulating material of the first sub-layer 210 may include yttrium oxide ($Y_2O_3$). The first inorganic insulating material of the first sub-layer 210 may include $Y_2O_3$ as a secondary component. Based on the total weight of the first sub-layer 210, the first sub-layer 210 may include at least one inorganic insulating material, including an element other than aluminum, in a range of about 0.1 weight % to about 20 weight %. For example, based on the total weight of the first sub-layer 210, the first sub-layer 210 may include $Y_2O_3$ in a range of about 0.1 weight % to about 20 weight %. For example, the first sub-layer 210 may include $Y_2O_3$ in a range of about 0.1 weight % to about 10 weight %.

The second inorganic insulating material of the second sub-layer 220 may include two or more types of inorganic insulating materials including zirconium oxide ($ZrO_2$). The second inorganic insulating material of the second sub-layer 220 may include $ZrO_2$ as a main component. For example, based on the total weight of the second sub-layer 220, the second sub-layer 220 may include $ZrO_2$ in a range of about 80 weight % or more. For example, the second sub-layer 220 may include $ZrO_2$ in a range of about 80 weight % to about 99.9 weight %. For example, the second sub-layer 220 may include $ZrO_2$ in a range of about 90 weight % to about 99.9 weight %.

The second inorganic insulating material of the second sub-layer 220 may include, as a secondary component, at least one inorganic insulating material including an element other than zirconium. The second inorganic insulating material of the second sub-layer 220 may include oxide, nitride, or fluoride of at least one metal selected from among aluminum, yttrium, magnesium, calcium, barium, titanium, tantalum, molybdenum, and germanium. In an embodiment, the second inorganic insulating material of the second sub-layer 220 may include $Ta_2O_5$. The second inorganic insulating material of the second sub-layer 220 may include $Ta_2O_5$ as a secondary component. Based on the total weight of the second sub-layer 220, the second sub-layer 220 may include at least one inorganic insulating material, including an element other than zirconium, in a range of about 0.1 weight % to about 20 weight %. Based on the total weight of the second sub-layer 220, the second sub-layer 220 may include $Ta_2O_5$ in a range of about 0.1 weight % to about 20 weight %. For example, the second sub-layer 220 may include $Ta_2O_5$ in a range of about 0.1 weight % to about 10 weight %.

The first inorganic insulating material of the first sub-layer 210 may have a different refractive index from the second inorganic insulating material of the second sub-layer 220. In case that a refractive index of the first inorganic insulating material is n1 and a refractive index of the second inorganic insulating material is n2, $n1 < n2$ may be satisfied.

The refractive index n1 of the first inorganic insulating material included in the first sub-layer 210 may be in a range of about 1.2 to about 2.0. For example, the refractive index n1 of the first inorganic insulating material may be in a range of about 1.4 to about 1.9. For example, the refractive index n1 of the first inorganic insulating material may be in a range of about 1.6 to about 1.8.

Figure 6:
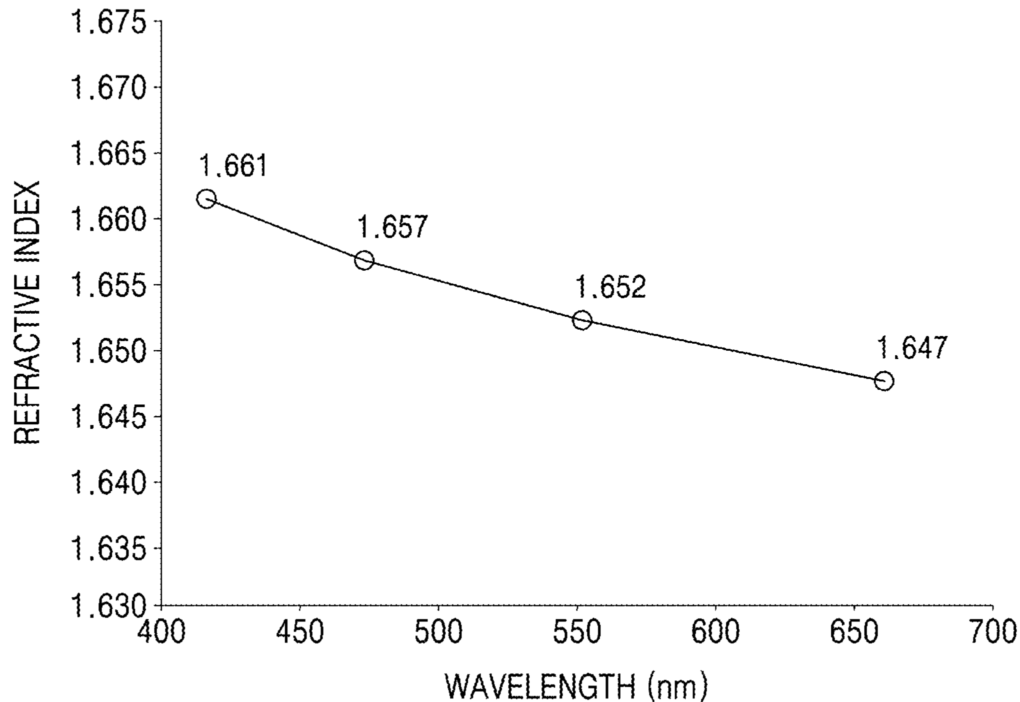
FIG. 6 is a graph illustrating a refractive index of a first sub-layer of an anti-reflection layer included in a window, according to an embodiment.

FIG. 6 is a graph illustrating a refractive index of the first sub-layer 210 included in the anti-reflection layer 200, according to an embodiment. For example, as shown in FIG. 6, the refractive index n1 of the first inorganic insulating material included in the first sub-layer 210 may be about 1.65. For example, the refractive index n1 of the first inorganic insulating material at a wavelength of about 550 nm may be about 1.65.

The refractive index n2 of the second inorganic insulating material included in the second sub-layer 220 may be in a range of about 1.5 to about 2.6. For example, the refractive index n2 of the second inorganic insulating material may be in a range of about 1.7 to about 2.4. For example, the refractive index n2 of the second inorganic insulating material may be in a range of about 1.9 to about 2.2.

Figure 7:
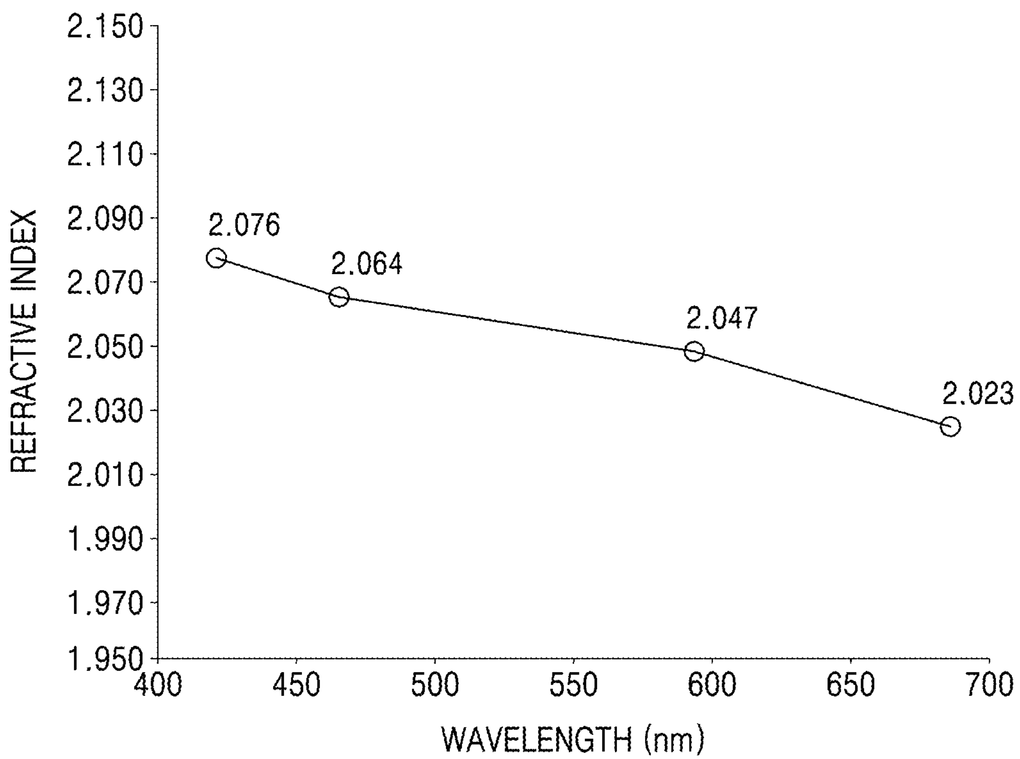
FIG. 7 is a graph illustrating a refractive index of a second sub-layer of an anti-reflection layer included in a window, according to an embodiment.

FIG. 7 is a graph illustrating a refractive index of the second sub-layer 220 included in the anti-reflection layer 200, according to an embodiment. For example, as shown in FIG. 7, the refractive index n2 of the second inorganic insulating material included in the second sub-layer 220 may be about 2.06. For example, the refractive index n2 of the second inorganic insulating material at a wavelength of about 550 nm may be about 2.06.

Referring to FIG. 5, the anti-reflection layer 200 may have a structure in which the first sub-layer 210 and the second sub-layer 220 are alternately stacked. In an embodiment, FIG. 5 illustrates that the anti-reflection layer 200 has an 8-layer structure, and the first sub-layer 210 includes four first sub-layers 211, 212, 213, and 214 and four second sub-layers 221, 222, 223, and 224. Hereinafter, for convenience of description, the four first sub-layers 211, 212, 213, and 214 may be referred to as a first-1 sub-layer 211, a first-2 sub-layer 212, a first-3 sub-layer 213, and a first-4 sub-layer 214, respectively, and the four second sub-layers 221, 222, 223, and 224 may be referred to as a second-1 sub-layer 221, a second-2 sub-layer 222, a second-3 sub-layer 223, and a second-4 sub-layer 224, respectively. The topmost layer of the anti-reflection layer 200 may be the first sub-layer 210. For example, FIG. 5 illustrates that the topmost layer of the anti-reflection layer 200 may be the first-4 sub-layer 214.

The first-1 sub-layer 211, the first-2 sub-layer 212, the first-3 sub-layer 213, and the first-4 sub-layer 214 may include the same material as each other. In an embodiment, the first-1 sub-layer 211, the first-2 sub-layer 212, the first-3 sub-layer 213, and the first-4 sub-layer 214 may include, for example, $Al_2O_3$ and $Y_2O_3$.

The thickness of each layer of the first sub-layer 210 may be in a range of about 8 nm to about 320 nm. In case that each layer of the first sub-layer 210 has a thickness in the above range, bonding strength with the second sub-layer 220 or the intermediate layer 300 may be ensured, and the reflectance of the window CW may be reduced.

The first-1 sub-layer 211, the first-2 sub-layer 212, the first-3 sub-layer 213, and the first-4 sub-layer 214 may have different thicknesses. For example, the thickness of the first-4 sub-layer 214 may be less than the thickness of the first-3 sub-layer 213, and the thickness of the first-2 sub-layer 212 may be greater than the thickness of the first-1 sub-layer 211. The thickness of the first-2 sub-layer 212 may be greater than the first-1 sub-layer 211. For example, in an embodiment, the thickness of the first-1 sub-layer 211 may be in a range of about 36 nm to about 44 nm. The thickness of the first-2 sub-layer 212 may be in a range of about 44 nm to about 55 nm. The thickness of the first-3 sub-layer 213 may be in a range of about 73 nm to about 90 nm. The thickness of the first-4 sub-layer 214 may be in a range of about 56 nm to about 69 nm. For example, the thickness of the first-1 sub-layer 211 may be about 40 nm, the thickness of the first-2 sub-layer 212 may be about 49.6 nm, the thickness of the first-3 sub-layer 213 may be about 81.9 nm, and the thickness of the first-4 sub-layer 214 may be about 62.5 nm. In an embodiment, in case that each of the first-1 sub-layer 211 to the first-4 sub-layer 214 has a thickness in the above range, the window CW may have excellent reflectance and transmittance (e.g., excellent cross-sectional reflectance and transmittance).

The thickness of each layer of the second sub-layer 220 may be in a range of about 8 nm to about 320 nm. In case that each layer of the second sub-layer 220 has a thickness in the above range, bonding strength with the window substrate 100 or the first sub-layer 210 may be ensured, and the reflectance of the window CW may be reduced.

The second-1 sub-layer 221, the second-2 sub-layer 222, the second-3 sub-layer 223, and the second-4 sub-layer 224 may have different thicknesses. For example, the second-2 sub-layer 222 may be greater than the second-1 sub-layer 221, the second-3 sub-layer 223, and the second-4 sub-layer 224. The second-4 sub-layer 224 may be greater than the second-3 sub-layer 223 and the second-1 sub-layer 221. The second-3 sub-layer 223 may be less than the second-1 sub-layer 221. For example, in an embodiment, the thickness of the second-1 sub-layer 221 may be in a range of about 13 nm to about 16 nm. The thickness of the second-2 sub-layer 222 may be in a range of about 63 nm to about 78 nm. The thickness of the second-3 sub-layer 223 may be in a range of about 9 nm to about 12 nm. The thickness of the second-4 sub-layer 224 may be in a range of about 57 nm to about 70 nm. For example, the thickness of the second-1 sub-layer 221 may be about 14.6 nm, the thickness of the second-2 sub-layer 222 may be about 70.9 nm, the thickness of the second-3 sub-layer 223 may be about 10.3 nm, and the thickness of the second-4 sub-layer 224 may be about 63.4 nm. In an embodiment, in case that each of the second-1 sub-layer 221 to the second-4 sub-layer 224 has a thickness in the above range, the window CW may have excellent reflectance and transmittance (e.g., excellent cross-sectional reflectance and transmittance).

Although FIG. 5 illustrates that the anti-reflection layer 200 has an 8-layer structure, embodiments are not limited thereto. For example, the anti-reflection layer 200 may have a 5-layer structure to a 13-layer structure.

The total thickness of the anti-reflection layer 200 may be in a range of about 230 nm to about 1300 nm.

In an embodiment, the anti-reflection layer 200 may include the first sub-layer 210 and the second sub-layer 220, which include materials having different refractive indices, and may have a structure in which the first sub-layer 210 and the second sub-layer 220 are stacked. Accordingly, the anti-reflection layer 200 may exhibit low reflection characteristics. For example, as light incident from the outside passes through sub-layers of the anti-reflection layer 200, which have different refractive indices, a path of the light may change, and light respectively reflected from the sub-layers of the anti-reflection layer 200, for example, the first sub-layer 210 and the second sub-layer 220, may destructively interfere with each other. Accordingly, the reflectance of the window CW including the anti-reflection layer 200 may be reduced.

In an embodiment, because the first inorganic insulating material of the first sub-layer 210 includes two or more types of inorganic insulating materials including $Al_2O_3$, and the second inorganic insulating material of the second sub-layer 220 includes two or more types of inorganic insulating materials including $ZrO_2$, hardness characteristics of the anti-reflection layer 200 may be improved. In more detail, although the anti-reflection layer 200 is formed by using electron beam deposition, the anti-reflection layer 200 may have excellent hardness characteristics. For example, the first sub-layer 210 may include $Al_2O_3$ and $Y_2O_3$, and the second sub-layer 220 may include $ZrO_2$ and $Ta_2O_5$. Accordingly, the anti-reflection layer 200 may have both low reflection characteristics and high hardness characteristics.

The anti-reflection layer 200 may be formed by using, for example, sputtering, atomic layer deposition (ALD), spin coating, pulsed laser deposition, or electron-beam (E-beam) vapor deposition. In an embodiment, the anti-reflection layer 200 may be formed by using E-beam vapor deposition. In case that the anti-reflection layer 200 is formed by using E-beam vapor deposition, the hardness characteristics may deteriorate compared to a case where sputtering is used. However, according to an embodiment, although the E-beam vapor deposition is used, the anti-reflection layer 200 may have excellent hardness characteristics.

The intermediate layer 300 may be disposed between the anti-reflection layer 200 and the anti-fingerprint layer 400. The intermediate layer 300 may include an inorganic insulating material. The intermediate layer 300 may include oxide, for example, $SiO_x$. In an embodiment, the intermediate layer 300 may include silica ($SiO_2$).

The intermediate layer 300 may be a layer that combines the anti-reflection layer 200 with the anti-fingerprint layer 400. The thickness of the intermediate layer 300 may be in a range of about 10 nm to about 30 nm. For example, the thickness of the intermediate layer 300 may be in a range of about 15 nm to about 25 nm. In an embodiment, the thickness of the intermediate layer 300 may be about 20 nm. In case that the thickness of the intermediate layer 300 is less than about 10 nm, bonding strength between the anti-reflection layer 200 and the intermediate layer 300 or between the intermediate layer 300 and the anti-fingerprint layer 400 is low, and thus, the intermediate layer 300 may be peeled off from the anti-reflection layer 200 or the anti-fingerprint layer 400. In case that the thickness of the intermediate layer 300 exceeds about 30 nm, destructively interfered external light may be reduced, and the reflectance of the window CW may increase.

The refractive index of the intermediate layer 300 may be lower than the refractive index of the second sub-layer 220 of the anti-reflection layer 200. The refractive index of the intermediate layer 300 may be in a range of about 1.2 to about 1.8. For example, the refractive index of the intermediate layer 300 may be in a range of about 1.3 to about 1.7. In an embodiment, the refractive index of the intermediate layer 300 may be about 1.52.

The intermediate layer 300 may be formed by using, for example, E-beam vapor deposition or sputtering. In an embodiment, the intermediate layer 300 may be formed by using E-beam vapor deposition.

The anti-fingerprint layer 400 may be arranged over the anti-reflection layer 200. In an embodiment, the anti-fingerprint layer 400 may include a different material from the anti-reflection layer 200. The anti-fingerprint layer 400 may include a fluorine-based compound. In an embodiment, the anti-fingerprint layer 400 may include perfluoropolyether (PFPE). However, embodiments are not limited thereto.

The thickness of the anti-fingerprint layer 400 may be in a range of about 10 nm to about 40 nm. For example, the thickness of the anti-fingerprint layer 400 may be in a range of about 10 nm to about 30 nm. In an embodiment, the thickness of the intermediate layer 300 may be about 20 nm. In case that the thickness of the anti-fingerprint layer 400 is less than about 10 nm, bonding strength between the anti-fingerprint layer 400 and the intermediate layer 300 is low, and thus, peeling may be facilitated. In case that the thickness of the anti-fingerprint layer 400 exceeds about 40 nm, wear resistance of the window CW including the anti-fingerprint layer 400 may decrease.

The anti-fingerprint layer 400 may be formed by using, for example, E-beam vapor deposition, sputtering, thermal deposition, or spin coating. In an embodiment, the anti-fingerprint layer 400 may be formed by using E-beam vapor deposition.

Figure 8:
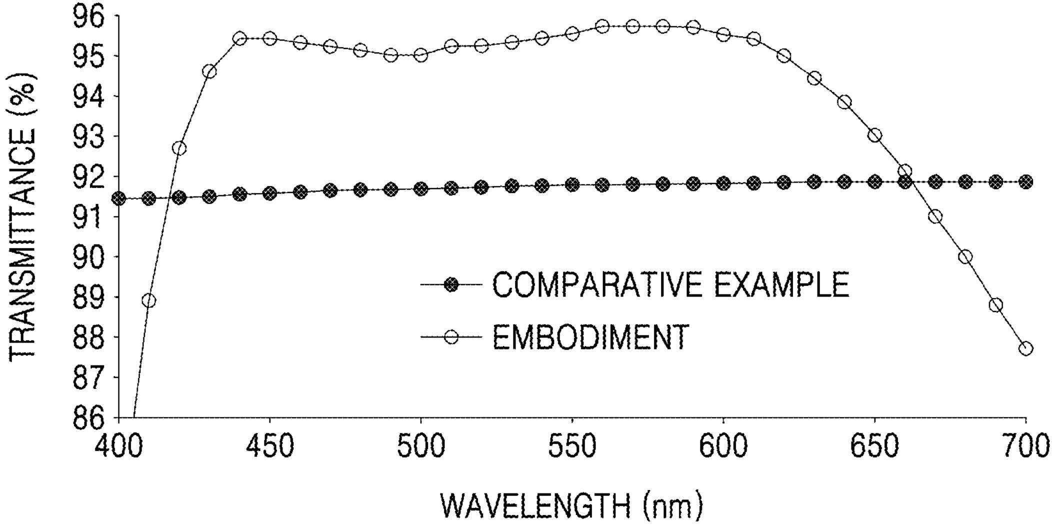
FIG. 8 is a graph illustrating transmittance of a window according to an embodiment and a comparative example.
Figure 9:
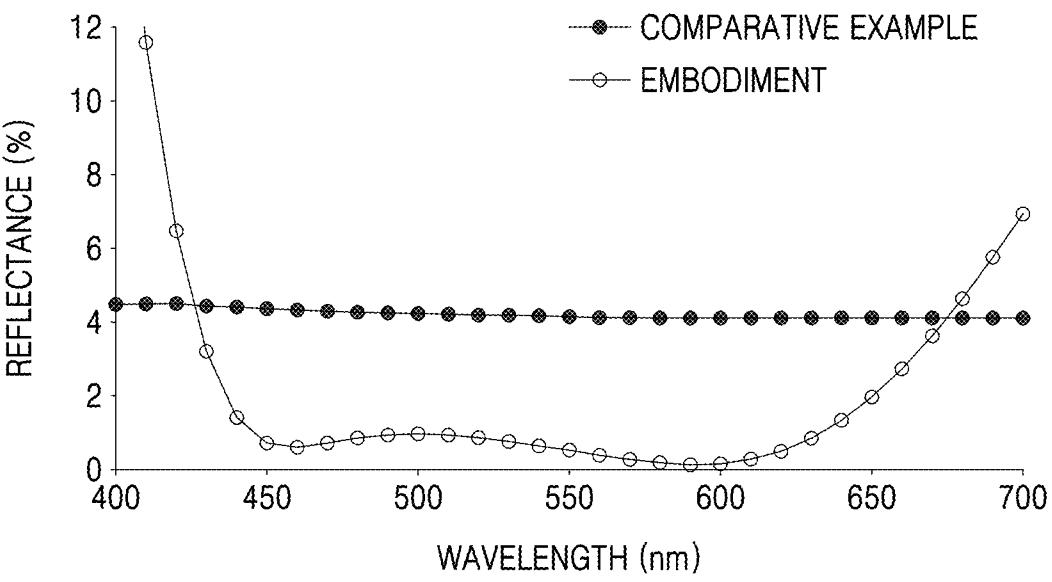
FIG. 9 is a graph illustrating reflectance of a window according to an embodiment and a comparative example.

FIG. 8 is a graph illustrating transmittance of a window according to an embodiment and a comparative example, and FIG. 9 is a graph illustrating reflectance of a window according to an embodiment and a comparative example.

In FIGS. 8 and 9, the window CW in the embodiment may include the window substrate 100, the anti-reflection layer 200, the intermediate layer 300, and the anti-fingerprint layer 400, which are described above, and a window substrate may be used in the comparative example. Compared to the comparative example, in the embodiment, the window CW may have increased transmittance and decreased reflectance (e.g., cross-sectional reflectance). In an embodiment, the reflectance (e.g., cross-sectional reflectance) of the window CW may be less than about 2.0%. For example, the reflectance (e.g., cross-sectional reflectance) of the window CW may be less than about 1.7%. For example, the reflectance (e.g., cross-sectional reflectance) of the window CW at a wavelength of about 450 nm to about 650 nm may be less than about 2%. The reflectance (e.g., cross-sectional reflectance) of the window CW at a wavelength of about 550 nm may be less than about 1.7%.

In an embodiment, the transmittance of the window CW may be in a range of about 93% or more. For example, the transmittance of the window CW may be in a range of about 93.5% or more. For example, the transmittance of the window CW may be in a range of about 93.5% to about 96%. For example, the transmittance of the window CW at a wavelength of about 450 nm to about 650 nm may be in a range of about 93% or more. The transmittance of the window CW at a wavelength of about 550 nm may be in a range of about 93.5% or more.

In an embodiment, surface hardness of the window CW may be in a range of about 10 GPa or more. For example, the surface hardness of the window CW may be in a range of about 11 GPa to about 16 GPa.

Table 1 is a table showing hardness measurement results of Embodiments 1 to 5, and Table 2 is a table showing hardness measurement results of Comparative Examples 1 and 2.

TABLE 1

| | | Hardness (GPa) | |
|---|---|---|---|
| Category | Indentation Depth (nm) | Average | Standard Deviation |
| Embodiment 1 | 100 | 11.5 | 0.5 |
| | 200 | 11.3 | 0.4 |
| | 300 | 11.1 | 0.1 |
| Embodiment 2 | 100 | 11.6 | 0.7 |
| | 200 | 11.5 | 0.4 |
| | 300 | 11.3 | 0.2 |
| Embodiment 3 | 100 | 11.4 | 0.4 |
| | 200 | 11.1 | 0.3 |
| | 300 | 11.0 | 0.3 |
| Embodiment 4 | 100 | 11.9 | 0.3 |
| | 200 | 11.4 | 0.3 |
| | 300 | 11.3 | 0.2 |
| Embodiment 5 | 100 | 11.9 | 0.6 |
| | 200 | 11.7 | 0.5 |
| | 300 | 11.3 | 0.2 |

TABLE 2

| Category | Indentation Depth (nm) | Hardness (GPa) Average | Standard Deviation |
|---|---|---|---|
| Comparative Example 1 | 100 | 6.9 | 0.3 |
| | 200 | 8.3 | 0.2 |
| | 300 | 8.6 | 0.2 |
| Comparative Example 2 | 100 | 7.4 | 0.2 |
| | 200 | 8.8 | 0.3 |
| | 300 | 8.6 | 0.2 |

In Embodiments 1 to 5, the window CW may include the window substrate 100, the anti-reflection layer 200, the intermediate layer 300, and the anti-fingerprint layer 400. The anti-reflection layer 200 may have a structure in which the first sub-layer 210, including $Al_2O_3$ as a main component and $Y_2O_3$ as a secondary component, and the second sub-layer 220, including as $ZrO_2$ a main component and $Ta_2O_5$ as a secondary component, are alternately stacked, and was formed by using E-beam vapor deposition. The window substrate 100 may include glass, the intermediate layer 300 may include $SiO_2$, and the anti-fingerprint layer 400 may include perfluoropolyether (PFPE).

In Comparative Examples 1 and 2, a window may include a window substrate, an anti-reflection layer, an intermediate layer, and an anti-fingerprint layer. The anti-reflection layer has a structure in which a first sub-layer including $Al_2O_3$ and a second sub-layer, including $ZrO_2$ as a main component and $Ta_2O_5$ as a secondary component, are alternately stacked, and was formed by using E-beam vapor deposition. The window substrate may include glass, the intermediate layer may include $SiO_2$, and the anti-fingerprint layer may include perfluoropolyether (PFPE).

Then, surface hardness was measured for Embodiments 1 to 5 and Comparative Examples 1 and 2. The hardness was measured at an indentation depth of about 100 nm to about 300 nm by using nanoindentation test. Results are shown in Tables 1 and 2.

Referring to Tables 1 and 2, it may be identified that, in Embodiments 1 to 5, the surface hardness was all measured to be in a range of about 10 GPa or more. For example, in Embodiments 1 to 5, the surface hardness measured at an indentation depth in a range of about 100 nm to about 300 nm was shown to be in a range of about 11 GPa or more. In contrast, it may be identified that, in Comparative Examples 1 and 2, the surface hardness was measured to be less than about 9 GPa. For example, it may be identified that, in Comparative Examples 1 and 2, the surface hardness measured at an indentation depth of 100 nm was less than about 8 GPa, and the surface hardness measured at an indentation depth of about 200 nm to about 300 nm was in a range of about 8 GPa to about 9 GPa.

In the embodiment, the first inorganic insulating material of the first sub-layer 210 included in the anti-reflection layer 200 of the window CW may include two or more types of inorganic insulating materials including $Al_2O_3$, and the second inorganic insulating material of the second sub-layer 220 may include two or more types of inorganic insulating materials including $ZrO_2$. For example, the first sub-layer 210 may include $Al_2O_3$ and $Y_2O_3$, and the second sub-layer 220 may include $ZrO_2$ and $Ta_2O_5$. According to the embodiment, although the anti-reflection layer 200 is formed by using E-beam vapor deposition, the anti-reflection layer 200 may have excellent hardness characteristics. The window CW including the aforementioned anti-reflection layer 200 may have excellent hardness characteristics. For example, the window CW may have a surface hardness of about 10 GPa or more.

Table 3 is a table showing initial contact angle evaluation results and wear resistance evaluation results of Embodiments 1 and 2.

TABLE 3

| Category | Initial Contact Angle (°) | Contact Angle after Friction | Contact Angle Change ((—)°) |
|---|---|---|---|
| Embodiment 1 | 118.6 | 112.7 | 5.9 |
| Embodiment 2 | 120.2 | 113.8 | 6.4 |

For Embodiments 1 and 2, the initial contact angle was evaluated, and then, the wear resistance was evaluated. First, for Embodiments 1 and 2, the initial contact angle was evaluated by dropping water on the surface of the anti-fingerprint layer 400 without applying friction, and then measuring a contact angle of the anti-fingerprint layer 400 with respect to water. The wear resistance was evaluated by applying a load of 1 kg, rubbing a rubber eraser, which was manufactured by Moonbangsawoo Co., 3000 times under the condition of a friction length of about 15 mm at a speed of about 40 times/min, and then measuring a contact angle of the anti-fingerprint layer 400 with respect to water. For example, the contact angle of the surface of the anti-fingerprint layer 400 with respect to water was measured. For example, it was determined that an evaluation criterion was satisfied in case that the contact angle of the anti-fingerprint layer 400 with respect to water was about 100° or more.

Referring to Table 3, the initial contact angle in Embodiment 1 was measured to be about 116° or more, and the initial contact angle in Embodiment 2 was measured to be about 120° or more. Even after the wear resistance was evaluated, the contact angles with respect to water in Embodiments 1 and 2 were measured to be respectively about 112.7° and about 113.8°, both of which are at least about 112°. For example, it may be identified that, in Embodiments 1 and 2, even after the wear resistance was evaluated, the contact angle is about 100° or more and thus satisfies an evaluation criterion. For example, it may be verified that the window CW according to the embodiment has excellent reliability.

As described above, the one or more embodiments have been described with reference to the accompanying drawings, but the embodiments should be considered in a descriptive sense only. Those of ordinary skill in the art will understand that various modifications and changes to the embodiments may be made therefrom. Therefore, the true technical scope of protection of the disclosure should be defined by the technical spirit of the appended claims.

According to the one or more embodiments as described above, a window having high hardness and low reflection characteristics, and a display panel DP including the window CW may be implemented. However, the scope of the disclosure is not limited by the above effects.

In concluding the detailed description, those skilled in the art will appreciate that many variations and modifications may be made to the embodiments without substantially departing from the principles and spirit and scope of the disclosure. Therefore, the disclosed embodiments are used in a generic and descriptive sense only and not for purposes of limitation.

What is claimed is:

1. A window comprising:
a window substrate;
an anti-reflection layer disposed on the window substrate;
an anti-fingerprint layer disposed over the anti-reflection layer; and
an intermediate layer disposed between the anti-reflection layer and the anti-fingerprint layer, wherein
the anti-reflection layer includes:
a first sub-layer including a first inorganic insulating material, and
a second sub-layer including a second inorganic insulating material different from
the first inorganic insulating material, and
the first inorganic insulating material includes two or more types of inorganic insulating materials including aluminum oxide.

2. The window of claim 1, wherein the first inorganic insulating material includes yttrium oxide.

3. The window of claim 1, wherein the first sub-layer includes at least about 80 weight % of aluminum oxide based on a total weight of the first sub-layer.

4. The window of claim 1, wherein the second inorganic insulating material includes two or more types of inorganic insulating materials including zirconium oxide.

5. The window of claim 4, wherein the second inorganic insulating material includes tantalum oxide.

6. The window of claim 4, wherein the second sub-layer includes at least about 80 weight % of zirconium oxide based on a total weight of the second sub-layer.

7. The window of claim 1, wherein the anti-reflection layer has a structure in which the first sub-layer and the second sub-layer are alternately stacked with each other.

8. The window of claim 1, wherein a refractive index of the first sub-layer is less than a refractive index of the second sub-layer.

9. The window of claim 1, wherein a refractive index of the first sub-layer is in a range of about 1.2 to about 2.0.

10. The window of claim 1, wherein a refractive index of the second sub-layer is in a range of about 1.5 to about 2.6.

11. The window of claim 1, wherein the window has a reflectance of less than about 2.0%.

12. The window of claim 1, wherein the window has a surface hardness of about 10 GPa or more.

13. A display panel comprising:
a substrate;
a display element arranged in a display area of the substrate, the display element including a first electrode, a second electrode, and an emission layer disposed between the first electrode and the second electrode;
an encapsulation member disposed on the display element; and
a window disposed on the encapsulation member, wherein the window includes:
a window substrate;
an anti-reflection layer disposed on the window substrate;
an anti-fingerprint layer disposed over the anti-reflection layer; and
an intermediate layer disposed between the anti-reflection layer and the anti-fingerprint layer,
the anti-reflection layer includes:
a first sub-layer including a first inorganic insulating material, and
a second sub-layer including a second inorganic insulating material different from
the first inorganic insulating material, and
the first inorganic insulating material includes two or more types of inorganic insulating materials including aluminum oxide.

14. The display panel of claim 13, wherein the first inorganic insulating material includes yttrium oxide.

15. The display panel of claim 13, wherein the first sub-layer includes at least about 80 weight % of aluminum oxide based on a total weight of the first sub-layer.

16. The display panel of claim 13, wherein the second inorganic insulating material includes two or more types of inorganic insulating materials including zirconium oxide.

17. The display panel of claim 16, wherein the second inorganic insulating material includes tantalum oxide.

18. The display panel of claim 13, wherein the anti-reflection layer has a structure in which the first sub-layer and the second sub-layer are alternately stacked with each other.

19. The display panel of claim 13, wherein a refractive index of the first sub-layer is less than a refractive index of the second sub-layer.

20. The display panel of claim 13, wherein a refractive index of the first sub-layer is in a range of about 1.2 to about 2.0.

21. The display panel of claim 13, wherein the window has a reflectance of less than about 2.0%.

22. The display panel of claim 13, wherein the window has a surface hardness of about 10 GPa or more.

* * * * *